(12) United States Patent
Ono et al.

(10) Patent No.: US 7,139,538 B2
(45) Date of Patent: Nov. 21, 2006

(54) ELECTRONIC COMPONENT FOR AMPLIFYING HIGH FREQUENCY POWER AND RADIO COMMUNICATION SYSTEM

(75) Inventors: Seikou Ono, Komoro (JP); Hitoshi Akamine, Maebashi (JP); Tetsuaki Adachi, Tomi (JP)

(73) Assignee: Renesas Technology Corp., Tokyo (JP)

( * ) Notice: Subject to any disclaimer, the term of this patent is extended or adjusted under 35 U.S.C. 154(b) by 117 days.

(21) Appl. No.: 10/520,706

(22) PCT Filed: Sep. 5, 2002

(86) PCT No.: PCT/JP02/09053

§ 371 (c)(1),
(2), (4) Date: Jan. 10, 2005

(87) PCT Pub. No.: WO2004/023649

PCT Pub. Date: Mar. 18, 2004

(65) Prior Publication Data

US 2005/0245212 A1    Nov. 3, 2005

(51) Int. Cl.
  *H04B 1/04* (2006.01)
  *H03C 1/62* (2006.01)
  *H01Q 11/12* (2006.01)
(52) U.S. Cl. .................... 455/127.1; 455/115.1; 330/285
(58) Field of Classification Search .......... 455/127.1, 455/115.1, 117, 572, 552.1, 127.3, 127.4, 455/126, 113, 226.1, 226.2, 343.1, 114.3; 330/291, 297, 257, 260, 285, 279, 133, 295
See application file for complete search history.

(56) References Cited

U.S. PATENT DOCUMENTS 6,605,999 B1 *  8/2003  Matsushita et al. ......... 330/285
6,919,762 B1 *  7/2005  Akamine et al. ........... 330/133
2004/0108902 A1 *  6/2004  Akamine et al. .......... 330/285
2004/0229579 A1 * 11/2004  Tsutsui et al. .......... 455/127.2

(Continued)

FOREIGN PATENT DOCUMENTS

JP        51-41282        11/1976

(Continued)

OTHER PUBLICATIONS

"Basic and Application of Microwaves", Jul. 10, 1997, Sogo Electronics Press, pp. 191-193.

(Continued)

*Primary Examiner*—Aung Moe
(74) *Attorney, Agent, or Firm*—Mattingly, Stanger, Malur & Brundidge, P.C.

(57) ABSTRACT

A high-frequency power module as a component of a radio communication system capable of performing communications in two frequency bands such as GSM and DCS and has a first transistor for output detection for receiving a signal which is the same as an input signal of a first power amplification transistor for amplifying a high frequency signal on the GSM side and a first current mirror circuit for passing current proportional to current of the transistor. A second transistor for output detection for receiving an input signal of a second power amplification transistor for amplifying a high frequency signal on the DCS side is also provided as is a second current mirror circuit for passing current proportional to current of the transistor. Conversion of current transferred from the first and second current mirror circuits to voltage is shared by the GSM and DCS.

17 Claims, 8 Drawing Sheets

U.S. PATENT DOCUMENTS

| | | | |
|---|---|---|---|
| 2005/0030100 A1* | 2/2005 | Dupuis et al. | 330/285 |
| 2005/0206456 A1* | 9/2005 | Suzuki et al. | 330/295 |
| 2005/0208905 A1* | 9/2005 | Numanami et al. | 455/114.3 |
| 2006/0012435 A1* | 1/2006 | Takahashi et al. | 330/285 |
| 2006/0068726 A1* | 3/2006 | Yamawaki | 455/126 |

FOREIGN PATENT DOCUMENTS

| | | |
|---|---|---|
| JP | 2000-151310 | 5/2000 |
| JP | 11-234148 | 8/2000 |
| JP | 2002-151982 | 5/2002 |

OTHER PUBLICATIONS

"Electronic Materials", Apr. 1999, Kogyo Chosakai Publishing Co., Ltd, pp. 91-95.

* cited by examiner

ELECTRONIC COMPONENT FOR AMPLIFYING HIGH FREQUENCY POWER AND RADIO COMMUNICATION SYSTEM

INCORPORATION BY REFERENCE

The present application claims priority from PCT application PCT/JP02/009053 filed on Sep. 5, 2002, the content of which is hereby incorporated by reference into this application.

TECHNICAL FIELD

The present invention relates to a technique effective when applied to a high-frequency power amplifying circuit for amplifying a high frequency signal and outputting the amplified signal and to a radio communication system such as a portable telephone in which the high-frequency power amplifying circuit is assembled. More particularly, the invention relates to a technique enabling the number of parts to be reduced by making elements of a circuit for detecting an output level necessary for an output power feedback control commonly used in a radio communication system having a plurality of high-frequency power amplifying circuits in accordance with transmission frequency bands.

BACKGROUND ART

Hitherto, there is a system called a GSM (Global System for Mobile Communication) using frequencies in a band of 880 to 915 MHz which is employed in Europe as one of systems of radio communication apparatuses (mobile communication apparatuses) such as mobile telephones. In the GSM, as a modulation system, a phase modulation system called GMSK (Gaussian Minimum Shift Keying) for shifting the phase of a carrier wave in accordance with transmission data is used.

Generally, a high-frequency power amplifying circuit for amplifying a modulated signal is assembled in a transmission-side output part in a radio communication apparatus. In a conventional GSM radio communication apparatus, to control the amplification factor of the high-frequency power amplifying circuit in accordance with a transmission request level from a control circuit such as a baseband circuit or a microprocessor, an output level of the high-frequency power amplifying circuit or an antenna is detected and fed back (for example, Japanese Patent Laid-open No. 2000-151310). Conventionally, the output level is generally detected by using a coupler, a detector, or the like, and the detector is often constructed as a semiconductor integrated circuit separate from the high-frequency power amplifying circuit.

The coupler is a device for detecting an output level via a capacitance formed between an output line (microstrip line) formed in a discrete part or an insulating substrate (module substrate) and a conductor disposed in parallel with the output line. The size of the coupler is larger than that of a device formed on a semiconductor chip. A directional coupler is described in, for example, "Basics and Application of Microwaves" issued on Jul. 10, 1997, Sogo Electronics Press, pp. 191 to 193. "Electronic Materials" issued in April, 1999 by Kogyo Chosakai Publishing Co., Ltd. pp. 91 to 95 describes a ceramic stacked-layer low-pass filter for mobile communication and a directional coupler.

Since the system of detecting the output level of the conventional high-frequency power amplifying circuit uses a number of semiconductor integrated circuits and electronic parts separate from the high-frequency power amplifying circuit, it is difficult to reduce the size of the module. In the case of using also a coupler, a reference voltage may be applied to one end of the coupler to improve detection sensitivity. In this case, optimum setting of the reference voltage and adjustment of a voltage according to variations in parts are necessary. Consequently, there is an inconvenience such that the burden on a setup maker increases. When the coupler is used, there is an inconvenience such that power loss also occurs.

Further, as a portable telephone of recent years, a dual-band portable telephone capable of handling not only a signal of the GSM but also a signal of a system such as a DCS (Digital Cellular System) using frequencies of, for example, 1710 to 1785 MHz is proposed. In a high-frequency power amplifying module used in such a portable telephone, an output power amplifier is provided for each of the bands and a coupler for detecting the output level of the module is also necessary for each of the bands. Consequently, it is difficult to reduce the size of the module.

An object of the invention is to provide an electronic component (module) for amplifying high-frequency power, realizing a reduced circuit scale and a reduced power loss in the case of detecting an output level in a radio communication system capable of performing communications in two frequency bands such as GSM and DCS, comparing the detected output level with a required output level, and controlling the amplification factor of a high-frequency power amplifying circuit for amplifying an input signal.

Another object of the invention is to provide an electronic component for amplifying high-frequency power, capable of detecting an output level necessary for feedback control in a current detecting method in a radio communication system capable of performing communications in two frequency bands such as GSM and DCS, so that it is unnecessary to adjust a voltage and the like and the load on a setup maker can be lessened.

Further, another object of the invention is to provide an electronic component for amplifying high-frequency power in a radio communication system capable of performing communications in two frequency bands such as GSM and DCS, in which leakage of a signal from a high-frequency power amplifying circuit in an idle state can be prevented at the time of transmission of the other high-frequency power amplifying circuit, and to a radio communication system using the same.

The above and other objects and novel features of the invention will become apparent from the description of the specification and attached drawings.

DISCLOSURE OF THE INVENTION

The outline of representative ones of inventions disclosed in the specification will be briefly described as follows.

According to the invention, an electronic component for amplifying a high-frequency power (RF power module) as a component of a radio communication system capable of performing communications in two frequency bands such as GSM and DCS includes: a first output detection transistor for receiving a signal which is the same as an input signal of a first power amplification transistor for amplifying a high frequency signal on the GSM side and a first current mirror circuit for passing current proportional to current of the transistor; and a second transistor for output detection for receiving an input signal of a second power amplification transistor for amplifying a high frequency signal on the DCS side and a second current mirror circuit for passing current proportional to current of the transistor. A sense resistor for converting current on the transfer side of the current mirror circuits to voltage, using the voltage as an output level detection signal, comparing the detected output level with a required output level, accordingly controlling the output level, and converting current transferred from the first and second current mirror circuits to voltage and, more preferably, a comparing circuit for comparing the detected output level with the requested output level are shared by the GSM and DCS.

When the output level of a high frequency signal in a first frequency band such as GSM and that of a high frequency signal in a second frequency band such as DCS are different from each other, each of the size ratio between the power amplification transistor in the final stage of a high-frequency power amplification circuit and the transistor for output detection and the size ratio between the transistors in the current mirror circuits is set so that magnitudes of currents flowing in the sense resistor become almost equal to each other in the case where either a first or second high-frequency power amplifying circuit operates at a maximum output level. With the configuration, the output level necessary for a feedback control can be detected by a current detecting method, so that power loss can be decreased. It is unnecessary to adjust a voltage and the like, so that the load on a setup maker can be lessened. Moreover, by sharing the sense resistor and the comparing circuit, the number of parts constructing the high-frequency amplifying circuit is decreased and the size of the radio communication system can be reduced.

Preferably, the electronic component for amplifying high-frequency power includes: a first amplifying circuit in which a plurality of power amplification transistors for amplifying a modulated high-frequency signal in a first frequency band are cascaded; and a second amplifying circuit in which a plurality of power amplification transistors for amplifying a modulated high-frequency signal in a second frequency band are cascaded. The first transistor for output detection and the second transistor for output detection are constructed so as to receive input signals of the power amplification transistors in the final stage of the first and second amplifying circuits. By constructing the power amplifying circuit by a plurality of amplification stages, for example, a control for applying a bias by which the gain in the first amplification stage is suppressed and the gain in the post amplification stages increases can be performed. Thus, it becomes easier to obtain desired characteristics as a whole, and an output level necessary for a feedback control can be detected by the current detecting method.

BEST MODE FOR CARRYING OUT THE INVENTION

Embodiments of the invention will be described in detail hereinbelow with reference to the drawings.

Figure 1:
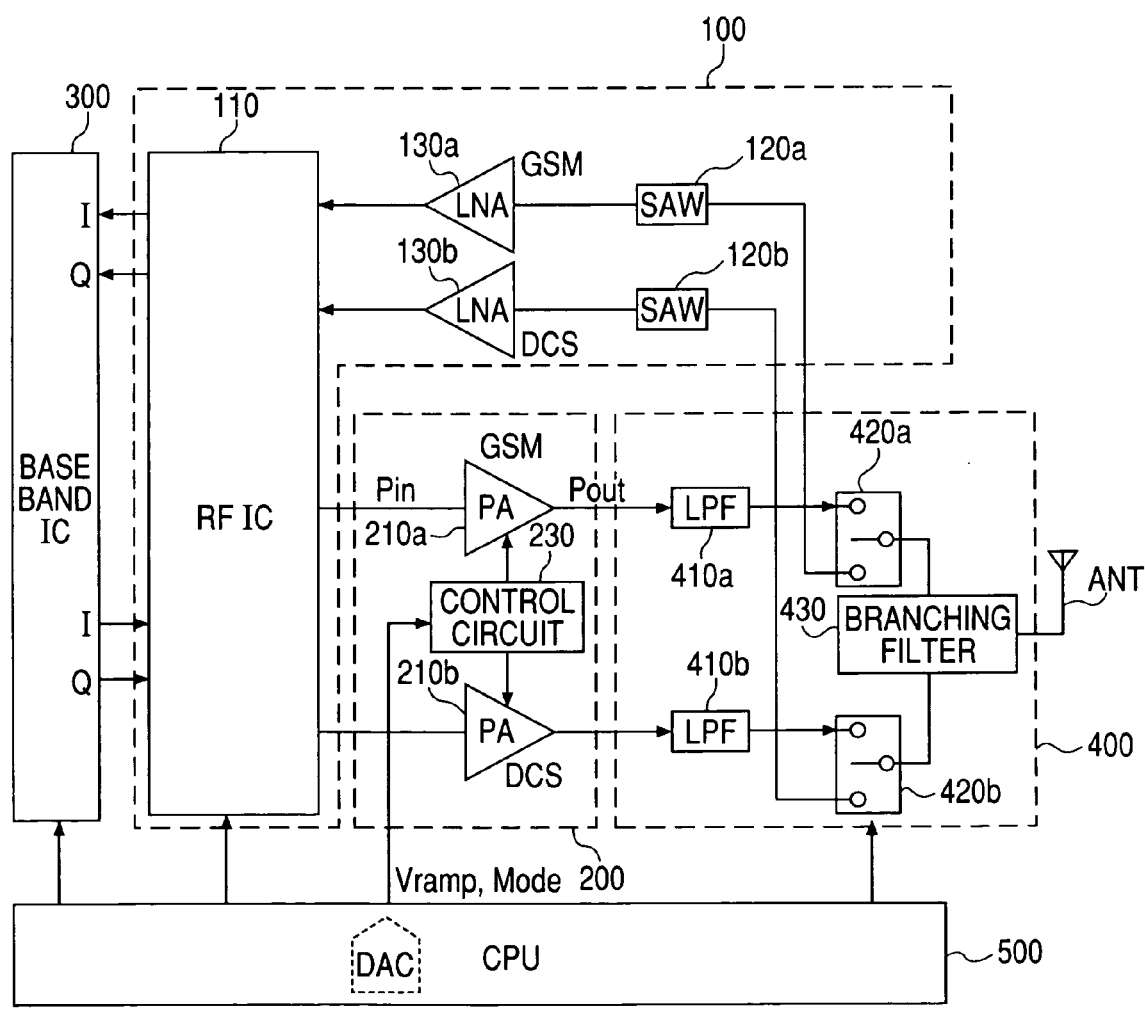
FIG. 1 is a block diagram showing an example of the configuration of a radio communication system using an electronic component for amplifying high-frequency power (hereinbelow, called an RF power module) according to the invention.

FIG. 1 shows a schematic configuration of a system capable of performing radio communications of two communication systems of GSM and DCS to which the invention is applied.

In FIG. 1, 100 denotes a high-frequency module (hereinbelow, called RF module) obtained by mounting a high-frequency signal processing circuit (RF IC) 110 formed as a semiconductor integrated circuit having a modulating/demodulating circuit capable of performing GMSK modulation and demodulation in the systems of GSM and DCS, band pass filters SAW taking the form of surface acoustic wave filters for removing unnecessary waves from a reception signal, low-noise amplifiers LNA for amplifying a reception signal, and the like on a ceramic substrate. 200 denotes an RF power module including high-frequency power amplifying circuits (hereinbelow, called power amplifiers) PA for transmitting a signal by driving the antenna ANT and an output power control circuit 230. 300 denotes a baseband circuit (hereinbelow, called a baseband IC) formed as a semiconductor integrated circuit for generating I and Q signals on the basis of transmission data (baseband signal) and processing I and Q signals extracted from a reception signal. 400 indicates a front end module including filters LPF for removing noise such as harmonics included in a transmission signal output from the power module 200, transmission/reception change-over switches, and a branching filter. 500 indicates a microprocessor (hereinbelow, called a CPU) for controlling the whole system by generating control signals to the RF IC 110 and the baseband IC 300 and generating an output level instruction signal Vramp to the RF power module 200.

As shown in FIG. 1, in the embodiment, the RF power module 200 has therein a power amplifier 210a for amplifying a transmission signal of 900 MHz in the frequency band of the GSM and a power amplifier 210b for amplifying a transmission signal of 1800 MHz in the frequency band of the DCS. Similarly, the RF module 100 has therein an SAW filter 120a and a low noise amplifier 130a for the GSM and an SAW filter 120b and a low noise amplifier 130b for the DCS.

In the RF IC 110, GMSK modulation of phase-modulating a carrier wave in accordance with desired information to be transmitted is performed, and the phase-modulated signal is input as a high frequency signal Pin to the RF power module 200 and amplified. Although not limited, in the embodiment, the RF IC 110 includes not only the modulating circuit for transmission but also a reception circuit constructed by a mixer for down-converting a reception signal to a signal of a lower frequency, a programmable gain amplifier of a high gain, and the like. The low noise amplifier LNA can be also provided in the RF IC 110.

The front end module 400 includes a low pass filter 410a for GSM, a low pass filter 410b for DCS, a change-over switch 420a for switching transmission/reception of the GSM, a change-over switch 420b for switching transmission/reception of the DCS, and a branching filter 430 which is connected to the antenna ANT and separates a signal for GSM and a signal for DCS from a reception signal. Although not shown in FIG. 1, the RF power module 200 or front end module 400 is provided with impedance matching circuits connected between the output terminals of the power amplifiers 210a and 210b or transmission output terminals of the RF power module 200 and the low pass filters 410a and 410b and performing impedance matching.

Figure 2:
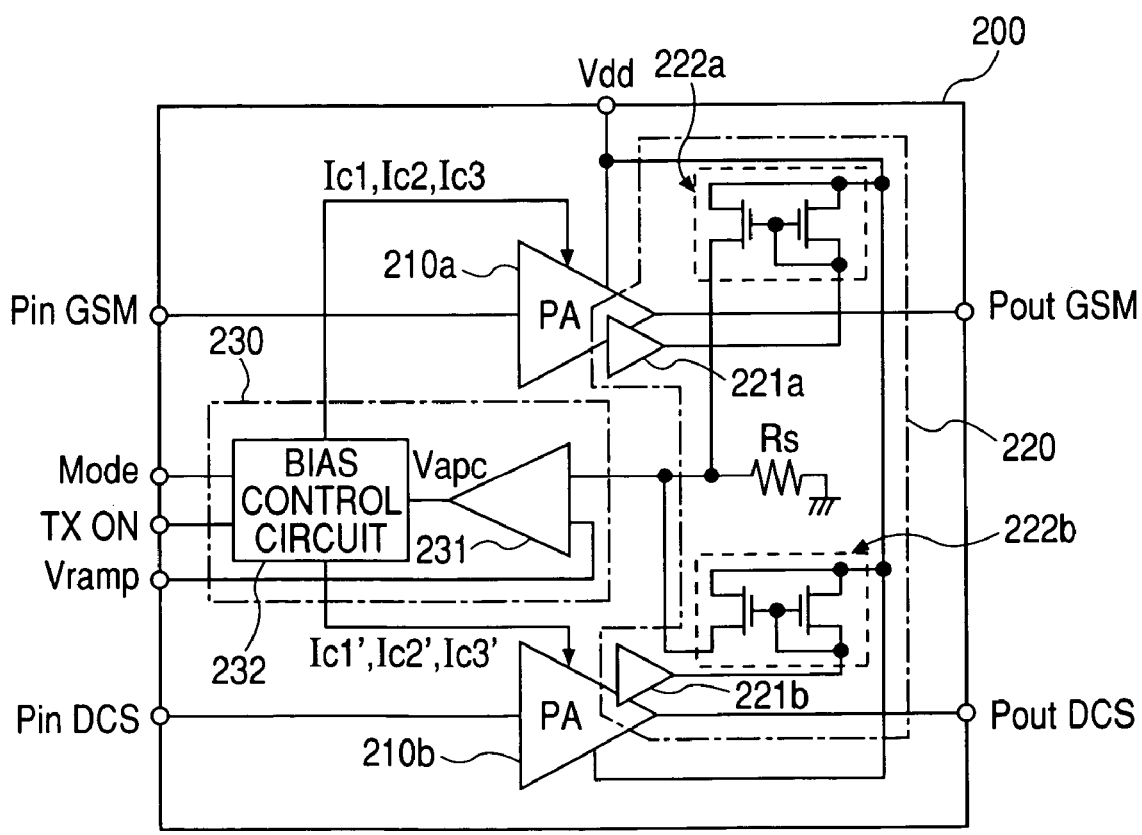
FIG. 2 is a circuit diagram showing an example of the RF power module according to the invention.

FIG. 2 shows a schematic configuration of a first embodiment of the RF power module 200 to which the invention is applied.

The RF power module 200 of the embodiment has: an output detection circuit 220 including amplifiers 221a and 221b for detecting output currents of the power amplifiers 210a and 210b, current mirror circuits 222a and 222b for generating current proportional to the current of the amplifiers, and a sense resistor Rs for converting current on a transfer side of the current mirror circuits to voltage; and the output power control circuit 230 for comparing a detection signal of the output detection circuit 220 with the output level instruction signal Vramp from the CPU 500 and controlling the power amplifiers 210 so that the output power of the power amplifiers 210a and 210b becomes a level according to the output level instruction signal Vramp.

The instruction level of the output level instruction signal Vramp is set to be low when it is near a base station as a communication party and is set to be high when it is far from the base station. The output level instruction signal Vramp may be generated in the RF IC 110 in response to an instruction from the CPU 500. The CPU 500 outputs not only the output level instruction signal Vramp but also a transmission start signal TXON to the RF power module 200. The transmission start signal TXON may be supplied to the RF power module 200 from the baseband LSI 300 or RF IC 110.

As shown in FIG. 2, in the embodiment, the sense resistor Rs is shared by a circuit for detecting output current of the power amplifier 210a on the GSM side and a circuit for detecting output current of the power amplifier 210b on the DCS side. Since the maximum level of the output power of the power amplifier 210a on the GSM side and that of the output power of the power amplifier 210b on the DCS side are specified according to standards and different from each other, the sense resistor Rs cannot be shared simply. In the embodiment, by the following devices, sharing of the sense resistor Rs is realized.

Since the sense resistor Rs has to be highly precise, it is mounted as a discrete part on the module. By sharing the sense resistor Rs by the GSM side and the DCS side as described above, the number of parts is decreased and the size of the module can be reduced. By mounting the sense resistor Rs as a discrete part on the module, the sense resistor Rs having a desired resistance value can be selected according to the characteristics of the power amplifiers 210a and 210b and mounted.

The output power control circuit 230 includes: a comparing circuit 231 for comparing a detection signal of the output detection circuit 220 with the output level instruction signal Vramp and generating an output control voltage Vacp according to the difference between the signals; and a bias control circuit 232 for generating and supplying bias currents Ic1, Ic2, and Ic3 to the power amplifiers 210a and 210b in accordance with the output control voltage Vapc output from the comparing circuit 231, a mode signal "Mode" supplied from the CPU 500 and indicative of the GSM mode of transmitting a signal in accordance with the GSM or the DCS mode of transmitting a signal in accordance with the DCS, and the like. When the circuit for detecting the output current of the power amplifier 210a on the GSM side and the circuit for detecting the output current of the power amplifier 210b on the DCS side share the sense resistor Rs, by adjusting current passed to the sense resistor Rs, the comparing circuit 231 can be also shared.

In the CPU 500 or baseband LSI 300, the characteristics of the RF IC 100 and RF power module 200 are obtained in advance, data in a table format indicative of the relation between the output level instruction signal Vramp necessary to output a desired output level signal from the RF power module 200 and a required output level is generated and stored in an internal nonvolatile memory or the like, and the output level instruction signal Vramp according to the required output level obtained by transmission/reception to/from a base station is generated with reference to the table and is output. When the RF IC 100 has a correction circuit for correcting variations in characteristics, correction data may be stored in a nonvolatile memory in the CPU 500 or baseband LSI 300.

Figure 4:
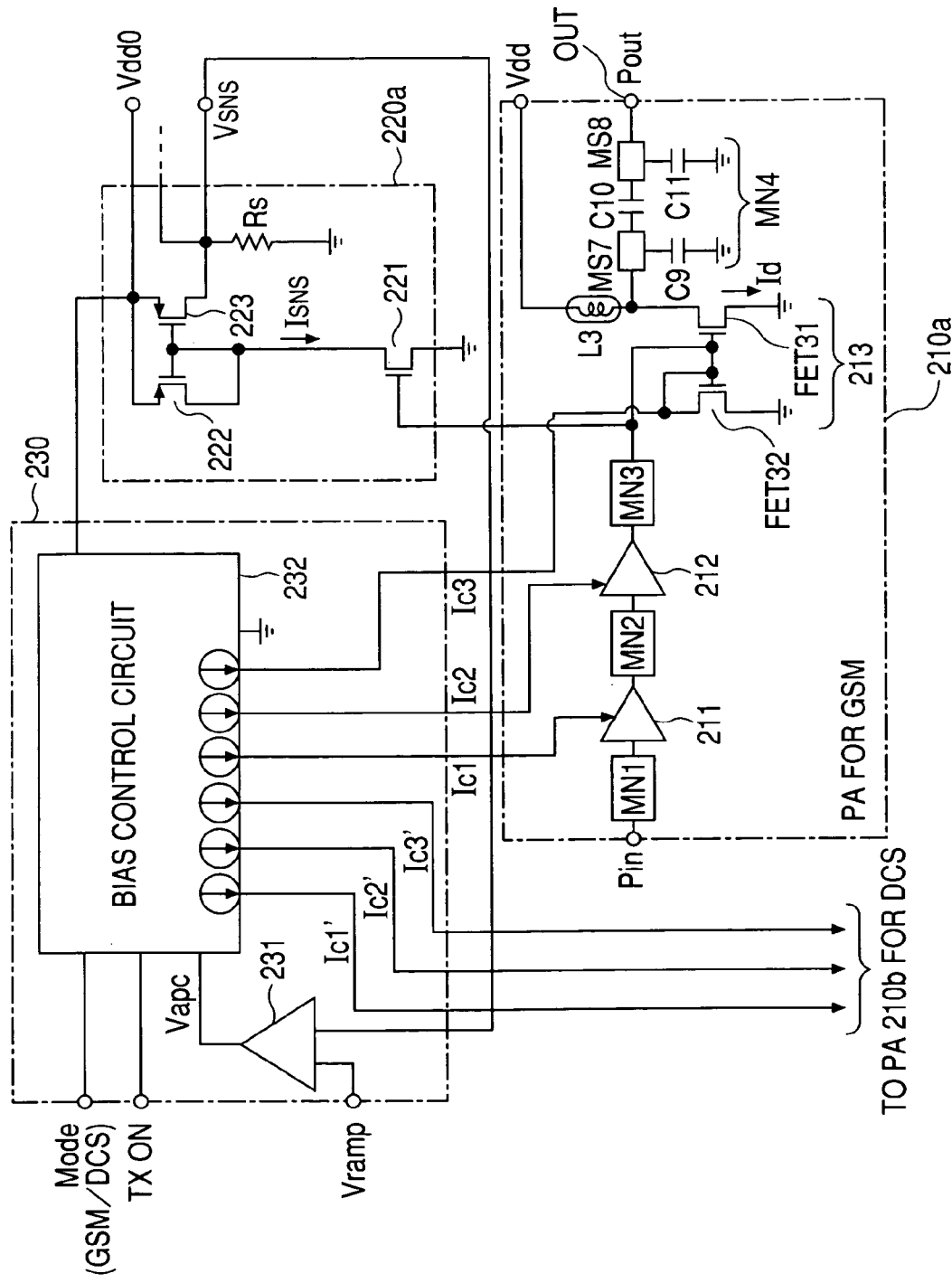
FIG. 4 is a circuit diagram showing a concrete example of a high-frequency power amplifying circuit and an output detection circuit in the RF power module of the embodiment.

FIG. 4 shows a concrete circuit example of the RF power module 200 in the embodiment. In FIG. 4, only the power amplifier 210a and an output detection circuit 220a on the GSM side are shown, and the power amplifier 210b and an output detection circuit 220b on the DCS side are not shown. Although not particularly limited, in the embodiment, the output power control circuit 230 for controlling the bias currents Ic1, Ic2, and Ic3 passed to the amplification stages of the power amplifier 210a is constructed as a circuit common for the GMS and DCS.

In the power amplifier 210 of the embodiment, three amplification stages 211, 212, and 213 are cascaded via impedance matching circuits MN1 to MN3 for blocking direct current and performing impedance matching. For each of the amplification stages, a field effect transistor (hereinbelow, described as FET) for power amplification is provided. FIG. 4 shows a concrete circuit configuration of the final amplification stage 213 and an impedance matching circuit MN4 at the post stage of the amplification stage 213. Although not shown, the first and second amplification stages 211 and 213 have a configuration similar to that of the final amplification stage 213. MS7 and MS8 denote microstrip lines functioning as inductance elements for matching impedances formed on the ceramic substrate.

The final amplification stage 213 is constructed by an FET 31 for power amplification whose gate terminal receives an output of the amplification stage 212 as the ante-stage via the impedance matching circuit MN3, and an FET 32 which is connected to the FET 31 to form a current mirror. A power source voltage Vdd is applied to the drain terminal of the FET 31 via an inductance element L3. By passing the control current Ic3 supplied from the bias control circuit 232 to the current mirror FET 32, drain current Id which is the same as the control current Ic3 or proportional to the control current Ic3 is passed to the FET 31. In such a manner, currents are passed in the first and second amplification stages 211 and 212.

By controlling the amplification factors of the amplification stages by the control currents Ic1, Ic2, and Ic3 of the amplification stages 211 to 213 by the bias control circuit 232, a signal Pout obtained by eliminating the direct current component in a high frequency input signal Pin and amplifying the alternate current component to a desired level is output from an output terminal OUT. In the embodiment, the control currents Ic1, Ic2, and Ic3 are controlled in accordance with an output of the comparing circuit 231 which compares the output level detected by the output detection circuit 220 with the output level designation signal Vramp.

The bias control circuit 232 starts operating in response to the start control signal TXON supplied from the CPU 500 (or baseband LSI 300) and generates the control currents Ic1, Ic2, and Ic3 in the GSM mode or control currents Ic1', Ic2', and Ic3'(Ic1'<Ic1, Ic2'<Ic2, and Ic3'<Ic3) to be supplied to the power amplifier 210b for DCS (not shown) in the DCS mode in accordance with the mode instruction signal Mode indicative of the GSM mode or DCS mode supplied from the CPU 500 (or baseband LSI 300) in order to bias the FETs 211, 212, and 213 in the stages.

The output detection circuit 220 is constructed by an N-channel MOSFET 221 having a gate terminal to which a voltage same as the gate voltage of the FET 31 for power amplification in the final stage 213 is applied, a P-channel MOSFET 222 connected to the MOSFET 221 in series between the MOSFET 221 and a power source voltage terminal Vdd0, a MOSFET 223 provided in parallel with the MOFET 222, and the sense resistor Rs for converting current to voltage, which is connected in series to the MOSFET 223.

The gate and drain of the MOSFET 222 are connected to each other and the gates of the MOSFETs 223 and 222 are commonly connected, thereby constructing a current mirror circuit. To suppress the current flowing in the output detection circuit 220, the MOSFET 221 for output detection which is smaller than the power amplification FET 31 is used. By applying a voltage same as the gate voltage of the power amplification FET 31 in the final stage to the gate terminal of the MOSFET 221, current proportional to the drain current of the FET 31 is passed to the MOSFET 221. The current is transferred by the current mirror circuit to the resistor Rs.

Therefore, a voltage VSNS of a connection node between the resistor Rs and the MOSFET 223 becomes a voltage proportional to the current of the power amplification FET 31 in the final stage. In the embodiment, the voltage VSNS is fed back as an output level detection signal to the comparing circuit 231 of the output power control circuit 230. The comparing circuit 231 compares the detection voltage VSNS with the output level designation signal Vramp from the CPU 500 and generates an output control voltage Vapc to the bias control circuit 232. The bias control circuit 232 generates the control currents Ic1, Ic2, and Ic3 supplied to the power amplifier 210a in accordance with the output control voltage Vapc.

Since the output detection circuit 220 of the embodiment is provided with the current mirror circuit, one output terminal for output detection is sufficient. Specifically, although the output detection circuit can be constructed only by the MOSFET 221 for output detection having the gate terminal to which a voltage same as the gate voltage of the power amplification FET 31 in the final stage is applied via a resistor Ri and the resistor (Rs) for current-voltage conversion connected to the MOSFET 221 in series, two terminals for outputting the voltage across both ends of the resistor for current-voltage to the outside are necessary. In contrast, by providing the current mirror circuit (222 and 223) and the resistor Rs for current-voltage conversion as in the embodiment and connecting one of the terminals of the resistor Rs to the ground, it becomes sufficient to use only one external terminal for output detection.

Further, in the embodiment, the size ratio between the power amplification FET 31 in the final stage of the power amplifiers 210a and 210b and the MOSFET 221 for output detection in the output detection circuit 220 and the size ratio between the current mirror MOSFETs 222 and 223 of the output detection circuit 220 are set as in the following table 1. The size ratio of FETs in the GSM and that in the DCS are different from each other for the reason that the maximum output level of the output terminal of the RF power module in the GSM is set as 34 dBm and that in the DCS is set as 32 dBm on the basis of maximum output levels at the antenna end determined in the GSM and DCS standards.

TABLE 1

|  | GSM | DCS |
| --- | --- | --- |
| maximum output level of RF power module | 34 dBm | 32 dBm |
| size ratio between power FET and sense FET | 683:1 | 293:1 |
| size ratio of MOSFETs in current mirror | 6:1 | 7.5:1 |
| drain current ISNS of FET for output detection | 10 mA | 12.5 mA |
| current flowing in sense resistor Rs | 1.67 mA | 1.67 mA |
| output power | 2 W | 1 W |

By setting the size ratio of the FETs as described above, the sense resistor Rs and the comparing circuit 231 can be shared by the GSM and DCS. There may be also a method of applying the gate input voltage of the power amplification FET 31 to the gate terminal of the MOSFET 221 for output detection in the output detection circuit 220 via the resistor and detecting the voltage as a DC level. However, by directly applying the voltage without using the resistor, an AC input can be obtained. In this manner, the correlation between the drain current Id of the power amplification FET 31 and the detection current ISNS can be made better.

Figure 3:
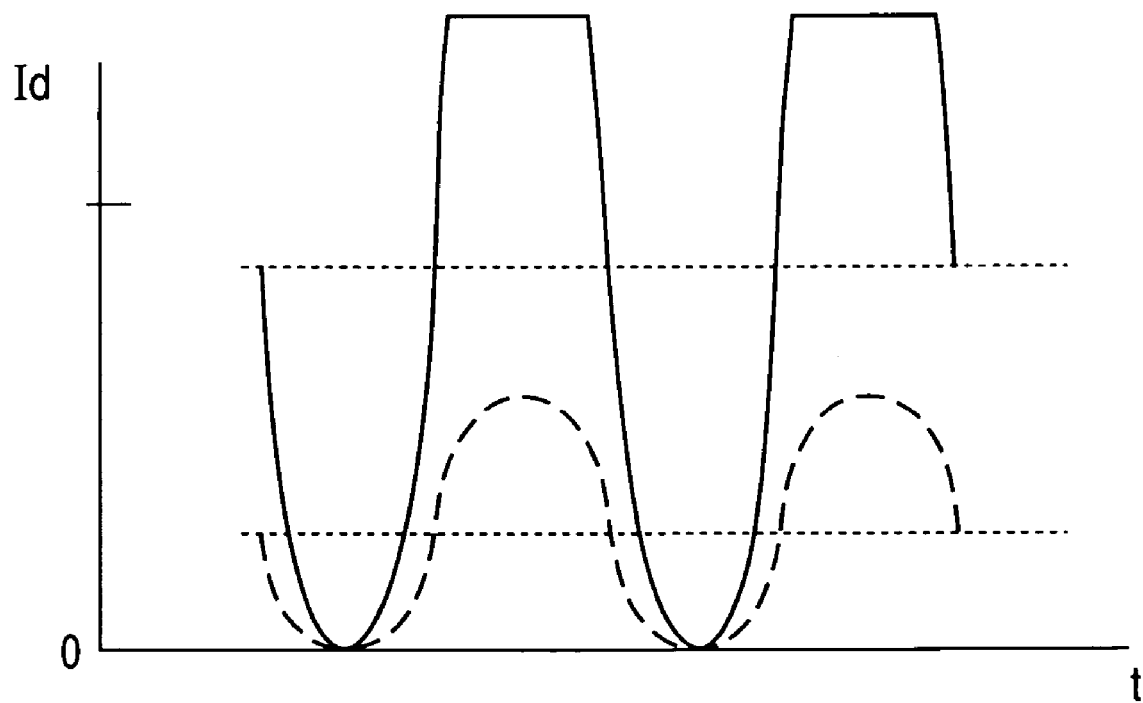
FIG. 3 is a current waveform diagram showing change with time of current flowing in the final stage in a high-frequency power amplifying circuit in the case where output power is high and that in the case where output power is low.

Concretely, at a low output level, the gain of the power amplification FET 31 is small, so that the drain current Id does not become saturated as shown by the broken line in FIG. 3. However, at a high output level, the gain of the FET 31 increases, so that the drain current Id becomes saturated as shown by the solid line in FIG. 3. On the other hand, when an input impedance of the output detection circuit 220 is high, an input signal is not easily transmitted, and the amplitude of the detection current ISNS is smaller than that of the drain current Id. Even in a state where the current Id becomes saturated, the detection current ISNS of the output detection circuit 220 does not become saturated, so that there is no correlation between the output current Iout and the detection current ISNS.

However, by applying the gate input of the power amplification FET 31 directly to the gate terminal of the MOSFET 221 for output detection, the input impedance for the high frequency signal becomes low, and an input signal is easily transmitted to the gate of the FET 221. When the FET 213 performs saturating operation, the FET 221 for output detection also performs saturating operation. Consequently, there is a correlation between the drain current Id of the FET 32 and the detection current ISNS and the output level can be detected at higher precision.

Figure 5:
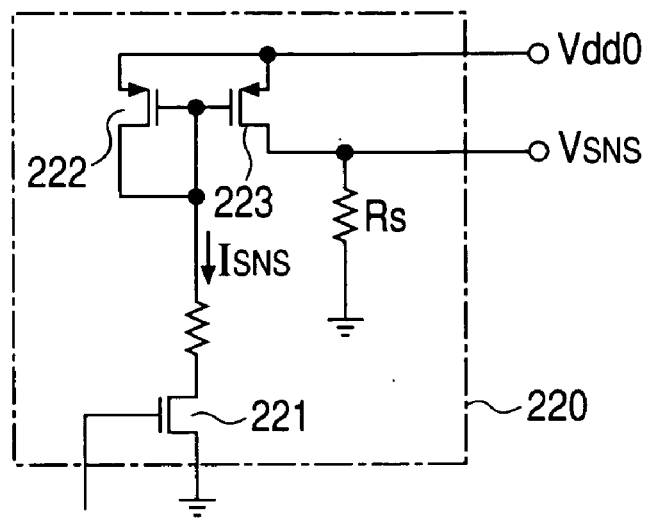
FIG. 5 is a circuit diagram showing another configuration example of the output detection circuit.

FIG. 5 shows another embodiment of the output detection circuit 220.

Figure 6:
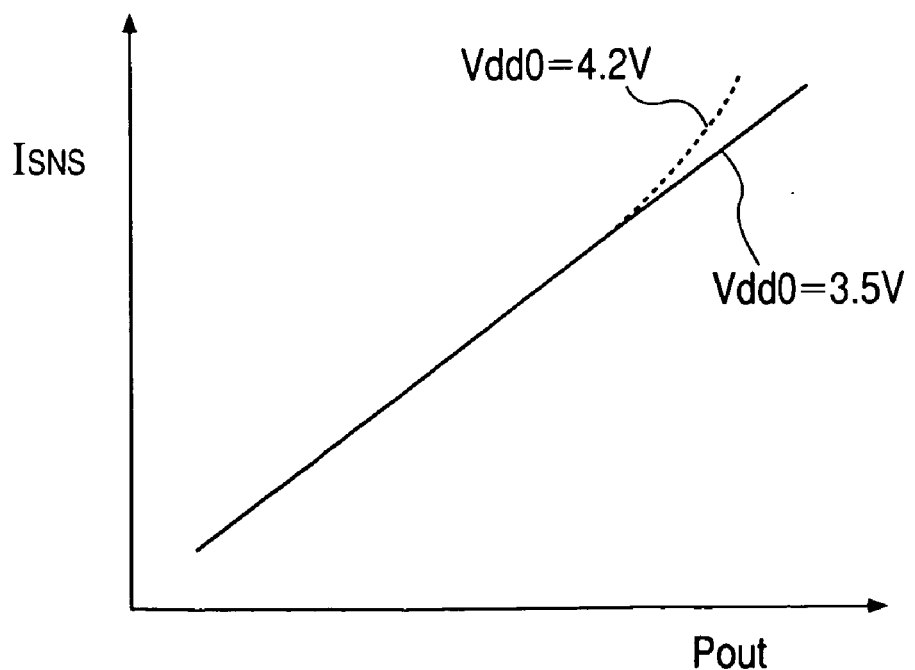
FIG. 6 is a graph showing the relation between output power Pout in the RF power module in the embodiment and detection current ISNS of the output detection circuit.

In the output detection circuit 220 of the embodiment, a resistor R4 for improving linearity is connected between the drain terminal of the FET 221 for output detection and the drain terminal of the MOSFET 222 as a component of the current mirror circuit. By the resistor R4, the power source voltage dependency of the output detection circuit 220 can be reduced. The correlation between the output power Pout and the detection current ISNS in the case where the resistor R4 for improving linearity is not provided is almost linear as shown by the solid line in FIG. 6 when the power source voltage Vdd0 is at a predetermined level such as 3.5V. When the power source voltage Vdd0 changes to a level such as 4.2V, however, current flowing in the FET 221 sharply increases in a region in which the output power is high as shown by the broken line in FIG. 6.

On the other hand, when the resistor R4 is provided, even if the power source voltage Vdd0 changes, the fluctuation amount of the drain voltage of the FET 221 is small. As a result, fluctuations in the current flowing in the FET 221 can be reduced. An example of the resistance value of the resistor R4 for improving linearity is about 100 Ω. The resistor R4 for improving linearity on the GSM side may be set to a value slightly larger than the resistor R4 for improving linearity on the DCS side.

Although not particularly limited, in the embodiment, the FET in each of the first and second amplification stages 211 and 212 (for both of the GSM and DCS) among the components constructing the RF power module 200, a MOSFET forming a current mirror circuit in cooperation with the FET, and the MOSFETs 222 and 223 constructing the current mirror circuit of the output power control circuit 230 and the output detection circuit 220 are formed as a semiconductor integrated circuit IC1 on a single semiconductor chip. The current mirror MOSFETs of the amplification stages 211 and 212 have the same conduction type (n-channel type) as that of the power amplification FETs and the same structure and, accordingly, have the same temperature characteristics. The fluctuations in characteristics of the power amplifier 210 accompanying fluctuations in temperature can be suppressed.

On the other hand, the FETs 31 (for both of the GSM and DCS) in the final stage 213 of the power amplifier 210, the MOSFETs 32 forming current mirror circuits in cooperation with the FETs 31, and the MOSFET 221 for output detection are formed as a semiconductor integrated circuit IC2 on another semiconductor chip. As the current-voltage converting resistor Rs and the resistor R4 for improving linearity of the output detection circuit 220, capacitative elements C9 to C11 in the impedance matching circuits MN1 to MN4, and inductance element L3, and the like, discrete parts are used.

The two semiconductor chips IC1 and IC2 and the elements such as the resistor Rs and capacitors C9 to C11 as discrete parts are mounted on a common ceramic substrate, thereby constructing a single electronic component (module) for radio communication. The microstrip lines MS7 and MS8 and the like are formed in a conductive layer pattern made of copper or the like on the ceramic substrate so as to have a desired inductance value. The semiconductor integrated circuit having the FET 31 in the final stage, the MOSFET 32 connected to the FET 31 so as to form a current mirror circuit, and the MOSFET 221 as a component of the output detection circuit 220 may be formed separately as a chip for GSM and a chip for DCS.

Figure 10:
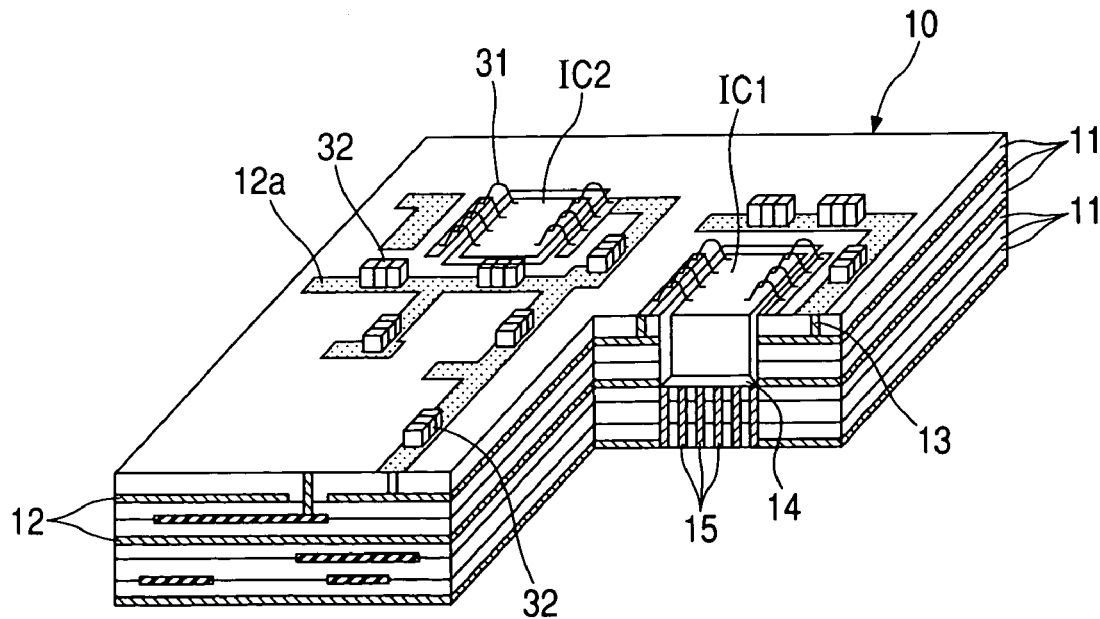
FIG. 10 is a partially-sectional perspective view schematically showing the device structure of the RF power module of the embodiment.

FIG. 10 shows the device structure of the RF power module of the embodiment. FIG. 10 does not accurately show the structure of the RF power module of the embodiment but is a structure diagram schematically showing the structure while omitting some parts, wirings, and the like.

As shown in FIG. 10, body 10 of the module of the embodiment has a structure in which a plurality of dielectric films 11 taking the form of ceramic films made of alumina or the like are stacked and integrated. On the surface or rear face of each of the dielectric films 11, a conductive layer 12 formed in a predetermined pattern and made of a surface-plated conductor such as copper is provided. 12*a* denotes a wiring pattern formed by the conductive layer 12. To connect the conductive layers 12 or wiring patterns on the surface and rear face of each dielectric film 11, a hole 13 called a through hole is formed and filled with a conductor.

In the module of the embodiment of FIG. 10, six dielectric films 11 are stacked. The conductive layer 12 is formed on the almost whole rear face of each of the first, third, and sixth layers, thereby obtaining a ground layer to which the ground potential GND is applied. The conductive layers 12 on the surface and rear face of each of the remaining dielectric films 11 are used for constructing transmission lines and the like. By properly setting the width of the conductive layer 11 and the thickness of the dielectric film 11, the transmission line is formed so that the impedance becomes 50 Ω.

In each of the first to third dielectric films 11, rectangular holes are formed to mount the semiconductor chips IC1 and IC2. Each of the ICs is inserted in the hole and fixed to the bottom of the hole by a jointing material 14. In the fourth dielectric film 11 corresponding to the bottom of the hole and the dielectric films 11 lower than the fourth dielectric film 11, holes 15 called via holes are formed and filled with a conductor. The conductor in the via holes plays the role of transmitting heat generated in the chips IC1 and IC2 to the lowest conductive layer to improve the discharging effect.

Electrodes on the top face of the chips IC1 and IC2 and a predetermined conductive layer 12 are electrically connected to each other via bonding wires 31. The conductive pattern 12*a* constructing the microstrip lines MS7 and MS8 and the like is formed on the surface of the first dielectric film 11, and a plurality of discrete parts 32 such as capacitative elements C9 to C11 and resistive elements Rs and R4 for forming the power amplifier 210, the output detection circuit 220, and the like are mounted. The capacitative elements out of the elements can be also formed on the inside of the substrate by using the conductive layers on the surface and rear face of the dielectric film 11 without using the discrete parts.

Figure 7:
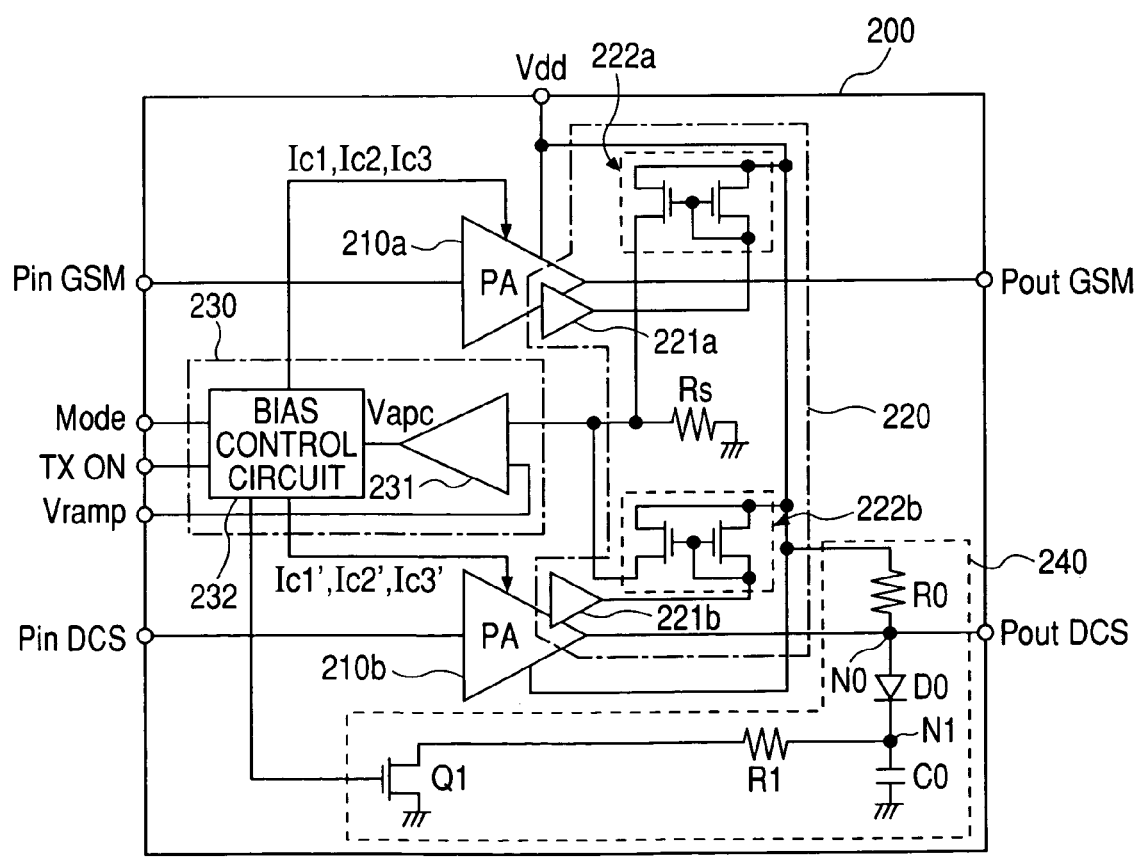
FIG. 7 is a circuit diagram showing a second embodiment of the RF power module.

FIG. 7 shows a schematic configuration of a second embodiment of the RF power module 200 to which the invention is applied.

In the RF power module 200 of the embodiment, an output terminal Pout-DCS of the power amplifier 210*b* on the DCS side is provided with a state switching circuit 240 including a resistor R0 connected between the output terminal Pout-DCS and the power source voltage terminal Vdd, a diode D0 and a capacitor C0 connected in series between the output terminal Pout-DCS and a reference potential point such as a ground potential, and a resistor R1 and a switch transistor Q1 connected between a connection node N0 of the diode D0 and the capacitor C0 and the ground point. The diode D0 is preferably a PIN diode. The value of the capacitative element C0 may be on the order of a few pF. The resistors R0 and R1 on the order of a few kΩ are used.

By forming the transistor Q1 on the semiconductor chip IC1 or IC2, increase in the number of parts can be suppressed.

The transistor Q1 is turned on in the GSM mode or turned off in the DCS mode in accordance with a control signal from the bias control circuit 232. In the DCS mode in which the transistor Q1 is turned off, a current path formed by the resistor R0, diode D0, resistor R1, and transistor Q1 is interrupted, so that the impedance of the diode D0 seen from a line through which a transmission signal is transmitted is high. The resistor R0 has resistance on the order of a few kΩ whereas the resistance of the transmission line is 50 Ω and the impedance is sufficiently high, so that the impedance ahead of the resistor R0 is not seen from the transmission line. Therefore, at this time, the power amplifier 210b operates in a manner similar to a circuit to which the state switching circuit 240 is not connected.

On the other hand, in the GSM mode in which the transistor Q1 is turned on, current flows in the path formed by the resistor R0, diode D0, resistor R1, and transistor Q1, and the potential of the output terminal of the power amplifier 210b is fixed. It can prevent that harmonics of twice as high as the GSM signal are transmitted to the power amplifier 210b and leaked to an output of the power amplifier 210a on the GSM side via a filter circuit in the post stage connected to the output terminal Pout-DCS and become noise in a transmission signal of the GSM transmitted from the antenna.

In the DCS mode in which the transistor Q1 is turned off, the diode D0 acts as a detection element and the node N1 on the cathode side of the diode D0 is fixed to a relatively high potential corresponding to the maximum amplitude level by a signal from the power amplifier 210b. Therefore, in the embodiment, by using an MOSFET of a high-withstand voltage as the transistor Q1, when the transistor Q1 is turned off and the potential at the node becomes high, the transistor Q1 can be prevented from being destroyed and leak current can be prevented from being passed to the transistor Q1. As the MOSFET of a high-withstand voltage, a known high-withstand-voltage element such as an LD (Laterally Diffused) MOS can be used.

The reason why a signal output from the power amplifier 210b on the DCS side is added to a transmission signal of the GSM in the GSM mode will be described with reference to FIG. 9.

Figure 9:
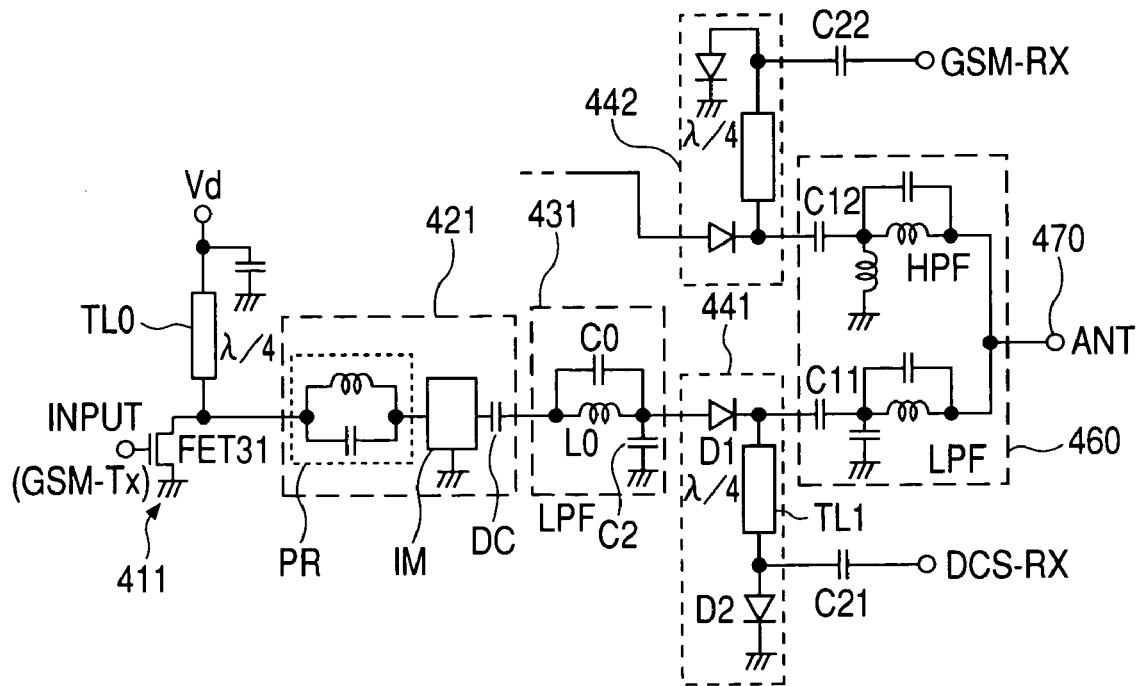
FIG. 9 is a circuit configuration diagram showing a concrete example of a front end module provided in the post stage of the RF power module of the embodiment.

FIG. 9 shows a concrete circuit configuration example of one of transmission parts (for example, DCS) in the front end module 400 connected at the post stage of the RF power module 200.

In FIG. 9, the FET 31 is a transistor in the final stage of the RF power module 200, a transmission signal is input to the gate terminal of the FET 31, the power source voltage Vd is applied to the drain terminal via a λ/4 transmission line TL0 having an electric length of ¼ wavelength of a fundamental wave, an impedance matching circuit 421 is connected to the connection node between the λ/4 transmission line TL0 and the drain terminal of the FET 31 and, at the post stage, a low pass filter 431, a transmission/reception switching circuit 441, and a branching filter 460 for branching a GSM reception signal and a DCS reception signal are sequentially connected.

Although not limited, in the embodiment, the impedance matching circuit 421 has a parallel resonance circuit PR constructed by an inductance element and a capacitative element, a matching means IM constructed by a transmission line and a capacitative element, and a capacitative element DC for eliminating direct current noise from the low pass filter 431 side to the power amplifier side. The constant of the circuit is set so that the impedance of the output node of the impedance matching circuit 421 becomes 50 Ω. The transmission/reception switching circuit 441 has a diode D1 connected between the low pass filter 431 and the branching filter 460 and a λ/4 transmission line TL1 and a diode D2 connected in series between the cathode terminal of the diode D1 and the ground point.

In the transmission/reception switching circuit 441, at the time of transmission, the diode D1 is turned on and a transmission signal from the power amplifier side is transmitted to the branching filter 460. At this time, the diode D2 is also turned on, the other end of the λ/4 transmission line TL1 is short-circuit to the ground potential, and the impedance seen from the diode D1 side to the λ/4 transmission line TL1 becomes high. Consequently, while preventing leakage of the signal to the reception side, the signal can be transmitted to the antenna ANT. On the other hand, at the time of reception, both of the two diodes D1 and D2 are turned off. Therefore, a reception signal from the antenna ANT is transmitted to the SAW filter 120A side in FIG. 1 via the branching filter 460, λ/4 transmission line TL1, and capacitor C21. The transmission/reception switching circuit 442 on the GSM side has a similar configuration, so that it will not be described.

In the case where the front end module 400 is constructed as shown in FIG. 9, the transmission/reception switching circuits 441 and 442 switch transmission/reception signals by the diodes D1 and D2, so that the signal transmission path from the power amplifier 210b to the antenna ANT cannot be completely interrupted. Since the DCS signal has a frequency about twice as high as that of the GSM signal, when harmonics twice as high as the GSM signal are transmitted from the power amplifier 210a on the GSM side to the power amplifier 210b on the DCS side, the harmonics cannot be blocked by the low pass filter 431. Consequently, it is feared that a leaked signal from the power amplifier 410b on the DCS side is added as a noise to a signal which is output from the power amplifier 410a on the GSM side to the antenna ANT in the GSM mode.

Therefore, as in the embodiment of FIG. 7, by providing the output terminal Pout-DCS of the power amplifier 210b on the DCS side with the state switching circuit 240, in the GSM mode, a leaked signal from the power amplifier 210b on the DCS side can be prevented from being added as a noise to a GSM transmission signal.

Figure 8:
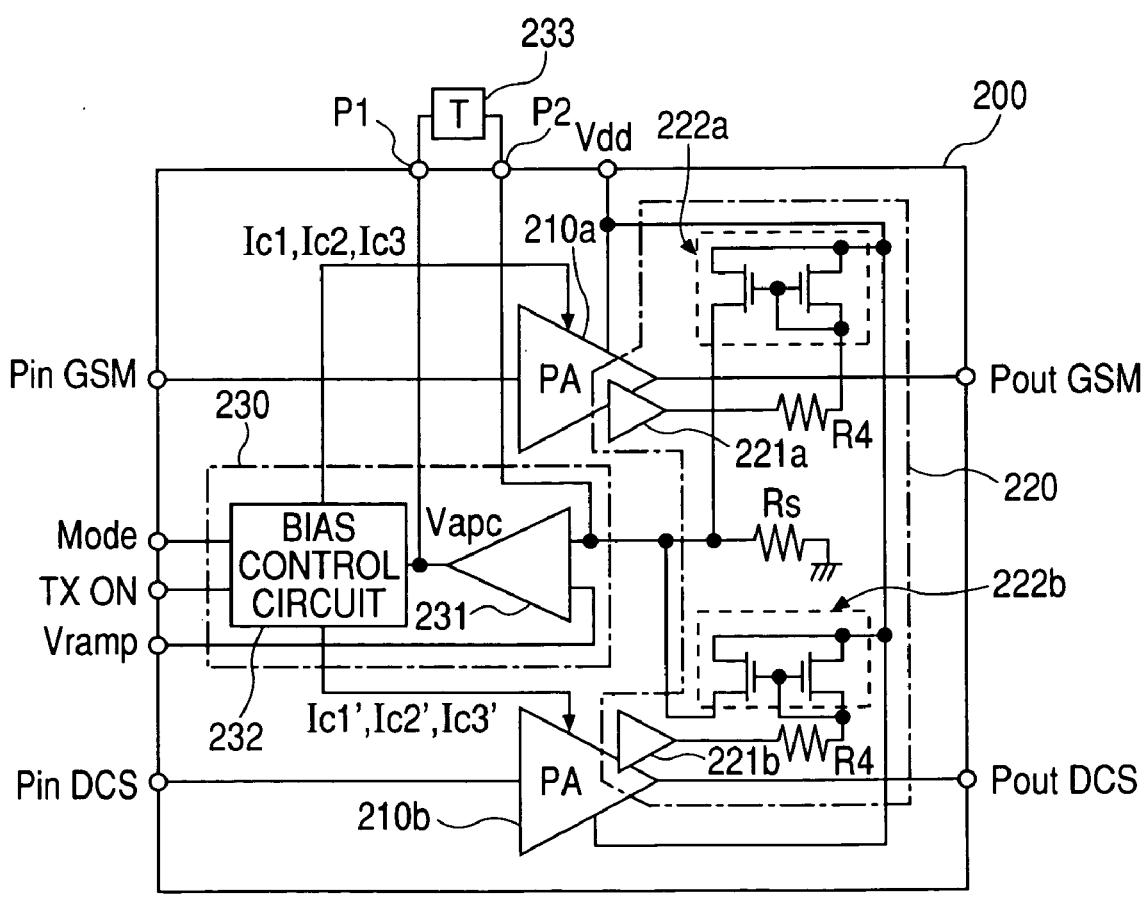
FIG. 8 is a circuit diagram showing a third embodiment of the RF power module.

FIG. 8 shows a schematic configuration of a third embodiment of the RF power module 200 to which the invention is applied.

In the RF power module 200 of the embodiment, a time constant circuit 233 functioning as a filter is provided between an input terminal to which a signal from the output detection circuit 220 is input and an output terminal of the comparing circuit 231, and external terminals P1 and P2 are provided for the module so that a resistive element and a capacitative element provided in parallel and constructing the time constant circuit 233 can be connected as external parts.

The output level instruction signal Vramp from the CPU 500, which is input to the other input terminal of the comparing circuit 231 is a signal having a stepped waveform which is output from a D/A converter in the CPU, and an output of the comparing circuit 231 also has a stepped waveform. The time constant circuit 233 acts to smooth the signal having the stepped waveform. By constructing the elements (resistive and capacitive elements) constructing the time constant circuit 233 so as to be connected as external elements, there is an advantage such that the user can arbitrarily set a time constant in accordance with a system designed by himself/herself and the characteristics of the system can be improved.

Although the invention achieved by the inventors herein has been concretely described above on the basis of the embodiments, obviously, the invention is not limited to the foregoing embodiments but can be variously modified without departing from the gist. For example, in the embodiments, the RF power module and the front end module are constructed as separate modules, they may be constructed as a single module.

In the RF power amplifier of the embodiments, the power amplification FETs are connected in three stages. The power amplification FETs can be also connected in two stages or four or more stages. Each of the FETs 212 and 213 in the second and third stages may be constructed by two FETs connected in parallel. Further, each of the power amplification FET in the first stage and the current-mirror FET may take the form of a dual-gate FET and a voltage obtained by dividing the bias current Ic1 from the bias control circuit 232 by a resistor is applied to each of the gates to pass a desired drain current.

Further, in the embodiments, it has been described that the RF power module is constructed by the semiconductor integrated circuit including the first and second amplification stages 211 and 212 and the output power control circuit 230, the semiconductor integrated circuit including the FET 31 and the current mirror FET 32 in the third stage and the FET 221 for output detection, and external elements such as resistive and capacitative elements. Alternately, the two semiconductor integrated circuits may be constructed as a single semiconductor integrated circuit.

INDUSTRIAL APPLICABILITY

Although the case where the invention is applied to the dual-band RF power amplifier capable of performing communications in the GSM and DCS modes has been described in the embodiments, the invention can be also applied to an RF power amplifier as a component of a triple-band communication system capable of performing communications not only in the GSM and DCS modes but also in a PCS (Personal Communications System) mode using a frequency band of 1900 MHz. In this case, DCS and PCS signals may be amplified by a common power amplifier or separate power amplifiers.

The invention claimed is:

1. An electronic component for amplifying high-frequency power, comprising:
    a first power amplification transistor for amplifying a modulated high-frequency signal in a first frequency band;
    a second power amplification transistor for amplifying a modulated high frequency signal in a second frequency band;
    a first transistor for output detection for receiving an input signal of said first power amplification transistor and a first current mirror circuit for passing current proportional to current of the transistor;
    a second transistor for output detection for receiving an input signal of said second power amplification transistor and a second current mirror circuit for passing current proportional to the current of the transistor;
    a sense resistor connected commonly on a transfer side of said first current mirror circuit and a transfer side of said second current mirror circuit and converting current to voltage; and
    a bias control circuit for comparing a signal detected by said sense resistor with an output request level instruction signal and generating a bias current for said first and second power amplification transistors.

2. The electronic component for amplifying high-frequency power according to claim 1, wherein when an output level of a high frequency signal in said first frequency band and that of a high frequency signal in said second frequency band are different from each other, a ratio between current in a transfer source of said first and second current mirror circuits and current on said transfer side of said first and second current mirror circuits is set so that magnitudes of currents flowing in said sense resistor become almost equal to each other in the case where either a first high-frequency power amplifying circuit or a second high-frequency power amplifying circuit operates at a maximum output level.

3. The electronic component for amplifying high-frequency power according to claim 2, further comprising a common comparing circuit for comparing a signal detected by said sense resistor with an output request level instruction signal supplied.

4. The electronic component for amplifying high-frequency power according to claim 3, wherein a time constant circuit is provided between one of an input terminal and an output terminal of said comparing circuit, and an external terminal for connecting an element of the time constant circuit as an external element is provided.

5. The electronic component for amplifying high-frequency power according to claim 1, wherein when an output level of the high frequency signal in said first frequency band and an output level of the high frequency signal in said second frequency band are different from each other, each of a size ratio between a transistor for amplification and a transistor for output detection in a final stage of said high-frequency power amplifying circuit and a size ratio of transistors constructing a current mirror circuit is set so that the magnitudes of currents flowing in said sense resistor become almost equal in the case where either a first high-frequency power amplifying circuit or a second high-frequency power amplifying circuit operates at a maximum output level.

6. The electronic component for amplifying high-frequency power according to claims 1, further comprising a transistor connected to said first power amplification transistor to form a current mirror circuit, and a transistor connected to said second power amplification transistor to form a current mirror circuit, wherein a bias voltage is applied to input terminals of said first and second power amplification transistors by passing a predetermined control current from said bias control circuit to said transistors for forming the current mirror circuits.

7. The electronic component for amplifying high-frequency power according to claims 1, wherein said first and second current mirror circuits and said comparing circuit are formed over the same semiconductor chip, and said sense resistor is connected as a discrete part.

8. The electronic component for amplifying high-frequency power according to claims 1, wherein a resistive element is provided each between said first transistor for output detection and the transistor in the transfer source of said first current mirror circuit and between said second transistor for output detection and the transistor in the transfer source of said second current mirror circuit.

9. The electronic component for amplifying high-frequency power according to claim 8, wherein said resistive elements are connected as discrete parts.

10. The electronic component for amplifying high-frequency power according to claim 1, comprising:
- a first amplifying circuit in which a plurality of power amplification transistors for amplifying said modulated high-frequency signal in said first frequency band are cascaded; and
- a second amplifying circuit in which a plurality of power amplification transistors for amplifying said modulated high-frequency signal in second frequency band are cascaded,
- wherein said first transistor for output detection and said second transistor for output detection are constructed so as to receive input signals of the power amplification transistors in the final stage of said first and second amplifying circuits.

11. The electronic component for amplifying high-frequency power according to claim 10, wherein said first amplifying circuit amplifies a GSM transmission signal and said second amplifying circuit amplifies a DCS transmission signal.

12. The electronic component for amplifying high-frequency power according to claim 11, further comprising:
- a diode and a capacitor connected in series between an output terminal of said second amplifying circuit and a reference potential point; and
- a switch transistor connected between a connection node of the diode and the capacitor and the reference potential point,
- wherein the switch transistor is turned on when said first amplifying circuit is operated and is turned off when said second amplifying circuit is operated.

13. The electronic component for amplifying high-frequency power according to claim 12, wherein said switch transistor is a MOSFET having high breakdown voltage.

14. A radio communication system comprising:
- an electronic component for amplifying high-frequency power according to claim 1;
- a second electronic component including a transmission/reception switching circuit for switching between a transmission signal and a reception signal by using a diode and a signal switching means for switching between a signal in a first frequency band and a signal in a second frequency band;
- a third electronic component for modulating a transmission signal and inputting the modulated signal to said electronic component for amplifying high-frequency power; and
- a semiconductor integrated circuit for applying an output request level instruction signal to said electronic component for amplifying high-frequency power.

15. An electronic component for amplifying high-frequency power, comprising:
- a first power amplification transistor for amplifying a modulated high frequency signal in a first frequency band;
- a second power amplification transistor for amplifying a modulated high frequency signal in a second frequency band;
- a first transistor for output detection for receiving an input signal of said first power amplification transistor and a first current mirror circuit for passing current at a first ratio to current of the transistor;
- a second transistor for output detection for receiving an input signal of said second power amplification transistor and a second current mirror circuit for passing current at a second ratio, which is different from said first ratio, to current of the transistor; and
- a converting circuit commonly connected to said first and second current mirror circuits and converting current to voltage,
- wherein a bias control circuit for comparing an output signal of said converting circuit with an output request level instruction signal and generating a bias current of said first power amplification transistor.

16. The electronic component for amplifying high-frequency power according to claim 15, wherein said bias control circuit generates bias current of said second power amplification transistor.

17. A radio communication system comprising:
- an electronic component for amplifying high-frequency power according to claim 15;
- a second electronic component including a transmission/reception switching circuit for switching between a transmission signal and a reception signal by using a diode and a signal switching means for switching between a signal in a first frequency band and a signal in a second frequency band;
- a third electronic part for modulating a transmission signal and inputting the modulated signal to said electronic component for amplifying high-frequency power; and
- a semiconductor integrated circuit for applying an output request level instruction signal to said electronic component for amplifying high frequency power.

* * * * *